(12) United States Patent
Xu et al.

(10) Patent No.: US 10,284,301 B2
(45) Date of Patent: May 7, 2019

(54) MULTI-CHANNEL TRANSCEIVER WITH LASER ARRAY AND PHOTONIC INTEGRATED CIRCUIT

(71) Applicant: FINISAR CORPORATION, Sunnyvale, CA (US)

(72) Inventors: Xiaojie Xu, Pleasanton, CA (US); Mark Donovan, Sunnyvale, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/847,824

(22) Filed: Dec. 19, 2017

(65) Prior Publication Data

US 2018/0359033 A1    Dec. 13, 2018

Related U.S. Application Data

(63) Continuation of application No. 14/215,520, filed on Mar. 17, 2014, now Pat. No. 9,847,840.

(60) Provisional application No. 61/791,495, filed on Mar. 15, 2013.

(51) Int. Cl.
*G02B 6/42* (2006.01)
*H04B 10/50* (2013.01)
*H01S 5/022* (2006.01)
*G02B 6/32* (2006.01)
*H01S 5/40* (2006.01)

(52) U.S. Cl.
CPC ......... *H04B 10/503* (2013.01); *G02B 6/4204* (2013.01); *G02B 6/32* (2013.01); *G02B 6/4208* (2013.01); *G02B 6/4215* (2013.01); *G02B 6/4249* (2013.01); *H01S 5/02288* (2013.01); *H01S 5/4087* (2013.01)

(58) Field of Classification Search
USPC ......................................................... 385/14
See application file for complete search history.

(56) References Cited

U.S. PATENT DOCUMENTS

2006/0114961 A1*  6/2006  Manni .................. H01S 3/0941
                                                        372/70

* cited by examiner

*Primary Examiner* — Eric Wong
(74) *Attorney, Agent, or Firm* — Maschoff Brennan

(57) ABSTRACT

A laser module can include: a laser chip having a plurality of laser diodes; a focusing lens optically coupled to each of the plurality of distinct laser diodes; and a photonic integrated circuit (PIC) having a plurality of optical inlet ports optically coupled to the plurality of laser diodes through the focusing lens. The laser module can include an optical isolator optically coupled to the focusing lens and PIC and positioned between the focusing lens and PIC. The laser chip can include a fine pitch laser array. The laser module can include a plurality of optical fibers optically coupled to an optical outlet port of the PIC. The laser module can include a hermetic package containing the laser chip and having a single focusing lens positioned for the plurality of laser diodes to emit laser beams there through.

20 Claims, 7 Drawing Sheets

MULTI-CHANNEL TRANSCEIVER WITH LASER ARRAY AND PHOTONIC INTEGRATED CIRCUIT

CROSS-REFERENCE

This patent application is a Continuation of U.S. patent application Ser. No. 14/215,520 filed Mar. 17, 2014, which claims priority to U.S. Provisional Application No. 61/791,495 filed Mar. 15, 2013, both of which are incorporated herein by reference in their entirety.

BACKGROUND

Lasers have become useful in a number of applications. For example, lasers may be used in optical communications to transmit digital data across a fiber-optic network. The laser or laser light emitted therefrom may be modulated by a modulation signal, such as an electronic digital signal, to produce an optical signal transmitted on a fiber-optic cable. An optically sensitive device, such as a photodiode, is used to convert the optical signal to an electronic digital signal transmitted through the fiber-optic network. Such fiber-optic networks enable modern computing devices to communicate at high speeds and over long distances.

Communication modules, such as electronic or optoelectronic transmitters, transceivers, or transponder modules are increasingly used in electronic and optoelectronic communication. Communication modules often communicate with a host computing device via a printed circuit board (PCB) by transmitting and/or receiving electrical data signals to and/or from the host computing device PCB. The electrical data signals can also be transmitted by the communication module outside a host device as optical and/or electrical data signals. Many communication modules include an optical subassembly (OSA) such as a transmitter optical subassembly (TOSA) and/or receiver optical subassembly (ROSA) to convert between the electrical and optical domains.

Generally, TOSA transforms an electrical signal received from the host computing device to an optical signal that is transmitted onto an optical fiber or other transmission medium. A laser diode or similar optical transmitter included in the TOSA is driven to emit the optical signal representing the electrical signal received from the host computing device. A ROSA transforms an optical signal received from an optical fiber or another source to an electrical signal that is provided to the host computing device. A photodiode or similar optical receiver included in the ROSA transforms the optical signal to the electrical signal.

The communication modules having the TOSA and/or ROSA can be implemented, for example, in high power computing applications such as between elements in data centers. In particular, a TOSA can include vertical-cavity surface-emitting lasers (VCSELs) positioned in a first element. A single mode VCSEL can transmit optical signal having a single wavelength along a single mode (SM) fiber. Also, a multimode VCSELs transmit optical signals having multiple wavelengths along a multimode (MM) fiber. The optical fibers can be connected to an ROSA in a second network element. The ROSA can include one or an array of pin photodiodes, for example. The ROSA can receive the optical signals from the TOSA over the optical fibers.

However, the power consumption requirements for the TOSA and/or ROSA optical interconnects are decreasing as the number of such optical interconnects increases. Thus, in data centers and in other high power computing applications, the optical interconnects act as power bottlenecks.

Recently, silicon photonics have been demonstrated as an alternative technology, which can form the basis of some optical interconnects. Generally, silicon photonics enable the communication of optical signals through a photonic circuit built on the silicon substrate. Because silicon substrates are already a medium of an electrical integrated circuit (IC), the incorporation of optical components into a silicon chip with electrical elements can be obtained using silicon photonics to form a photonic integrated circuit (PIC).

The subject matter claimed herein is not limited to embodiments that solve any disadvantages or that operate only in environments such as those described above. Rather, this background is only provided to illustrate one exemplary technology area where some embodiments described herein may be practiced.

SUMMARY

In one embodiment, a laser module can include: a laser chip having a plurality of laser diodes; a focusing lens optically coupled to each of the plurality of distinct laser diodes; and a photonic integrated circuit (PIC) having a plurality of optical inlet ports optically coupled to the plurality of laser diodes through the focusing lens. The laser module can include an optical isolator optically coupled to the focusing lens and PIC and positioned between the focusing lens and PIC. The laser chip can include a fine pitch laser array, wherein the fine pitch laser array can have a pitch from about 10 microns to about 50 microns. In one aspect, the plurality of laser diodes can emit laser beams that have the same wavelength. In one aspect, two or more of the plurality of laser diodes emit laser beams that have different wavelengths. The laser module can include a plurality of optical fibers optically coupled to an optical outlet port of the PIC. In one aspect, the PIC can have more optical output channels than the laser chip has laser diodes, wherein the number of optical output channels can be at least twice the number of laser diodes on the laser chip. The laser module can include a hermetic package containing the laser chip and having a single focusing lens positioned for the plurality of laser diodes to emit laser beams there through.

In one embodiment, the PIC can include: an integrated waveguide for each optical inlet port; an optical splitter optically coupled to each integrated waveguide that splits into two or more optical channels downstream from the optical splitter; and an integrated modulator for each optical channel. The plurality of optical inlet ports of the PIC can have a pitch of about 3× or 4× the pitch of the fine pitch laser array. The PIC can include a receiver photodiode.

In one embodiment, the laser module can include a wavelength-division multiplexing (WDM) device optically coupled to an optical outlet port of the PIC.

In one embodiment, a transmitter can have a laser module including: a laser chip having a plurality of laser diodes in a fine pitch laser array; a focusing lens optically coupled to each of the plurality of distinct laser diodes; an optical isolator optically coupled to the focusing lens; and a photonic integrated circuit (PIC) having a plurality of optical inlet ports optically coupled to the plurality of laser diodes through the focusing lens and optical isolator, wherein the PIC has at least twice more optical output channels than the laser chip has laser diodes. The transmitter can include a hermetic package containing the laser chip and having a single focusing lens positioned for the plurality of laser diodes to emit laser beams there through. The PIC of the transmitter can include: the plurality of optical inlet ports having a pitch of about 3× or 4× the pitch of the fine pitch laser array; an integrated waveguide for each optical inlet port; an optical splitter optically coupled to each integrated waveguide that splits into two or more optical channels downstream from the optical splitter; and an integrated modulator for each optical channel.

In one embodiment, a transceiver can include a transmitter laser module having: a laser chip having a plurality of laser diodes in a fine pitch laser array; a focusing lens optically coupled to each of the plurality of distinct laser diodes; an optical isolator optically coupled to the focusing lens; and a photonic integrated circuit (PIC) having a plurality of optical inlet ports optically coupled to the plurality of laser diodes through the focusing lens and optical isolator, wherein the PIC has at least twice more optical output channels than the laser chip has laser diodes. The transceiver also includes a receiver photodiode. The transceiver can include a hermetic package containing the laser chip and having a single focusing lens positioned for the plurality of laser diodes to emit laser beams therethrough. The PIC can include: a plurality of optical inlet ports having a pitch of about 3× or 4× the pitch of the fine pitch laser array; an integrated waveguide for each optical inlet port; an optical splitter optically coupled to each integrated waveguide that splits into two or more optical channels downstream from the optical splitter; and an integrated modulator for each optical channel. In one aspect, the PIC can include the receiver photodiode. In one aspect, a receiver module separate from the transmitter laser module can include the receiver photodiode.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
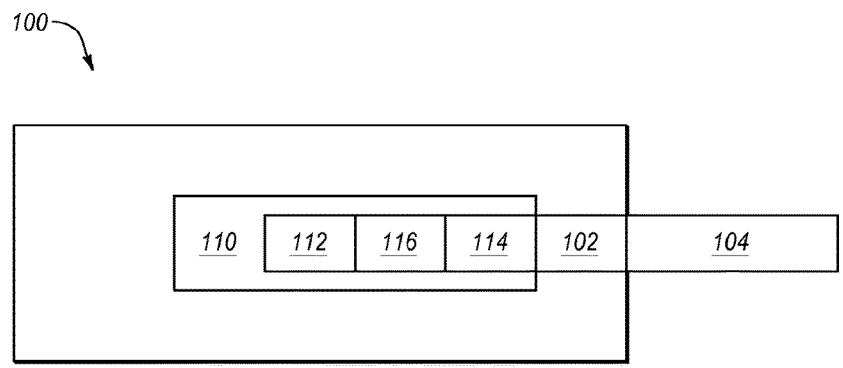
FIG. 1 illustrates an embodiment of a transmitter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present invention includes a laser module having a laser array optically coupled with a photonic integrated circuit (PIC) having a plurality of output optical fibers. The laser array can include a plurality of lasers that are separate from each other or a plurality of laser emitters in a single laser package or single laser substrate. The laser array can be a pitched laser array. The laser array may be a fine pitched laser array. The lasers can include continuous wave lasers, such as continuous wave (CW) distributed feedback (DFB) laser or distributed Bragg reflector (DBR) laser. As such, the laser can include a fine pitched CW DFB laser array with a PIC. The output optical fibers from the PIC can be one or more unique optical fibers or a fiber ribbon having a plurality of optical fibers therein. The laser module can include one or more output optical fibers for each of the lasers in the laser array. While the CW DFB laser array is described herein, the principles can be applied to other laser arrays as known or developed in the art.

The laser module having the fine pitched laser array with a PIC can be configured for single mode (SM) and/or multi-mode (MM) operation. As such, the laser module having the fine pitched laser array with a PIC can be configured for high density optical communication platforms. In one aspect, the laser array can include a plurality of high power CW laser as the optical sources. However, the laser array can include DFB lasers as the optical source in order to provide high speed optical data transmission. The DFB lasers can be configured as low power optical sources. The DFB lasers of the laser array can be configured as described herein or generally known in the art.

The laser module having the fine pitched laser array with a PIC can be configured for high density and high speed parallel SM-MM optical data transmission. As such, the laser module can include a PIC with a plurality of optical inlets and a plurality of optical outlets. The PIC can receive two or more optical light beams from the laser array and transmit optical light through a plurality of output optical fibers. The laser array thereby provides the optical source for the PIC for parallel SM and MM fiber optical communications.

In one embodiment, the laser module can be included in a transmitter module or a transceiver module. The transceiver can have the fine pitched laser array with PIC as a transmitter and any type of receiver compatible therewith. For example, the receiver can be any type of photodiode receiver, which may be packaged with the transmitter or separately therefrom in the transceiver module. Also, the PIC can be configured as a receiver of a transceiver.

Embodiments of the invention described herein may be implemented in optoelectronic devices. As used herein, the term "optoelectronic device" includes a device having both optical and electrical components. Examples of optoelectronic devices include, but are not limited to transponders, transceivers, transmitters, and/or receivers. While some embodiments described herein will be discussed in the context of a transceiver module, those of skill in the art will recognize that the principles of the present invention may be implemented in virtually any device having some or all of the functionality described herein. The principles of the invention can be implemented in optoelectronic devices of any form factor such as XFP, SFP, SFP+, SFF, XENPAK, and XPAK, or others known or developed without restriction. Alternatively or additionally, the optoelectronic device can be suitable for optical signal transmission and reception at a variety of per-second data rates, including but not limited to 1 gigabit per second (Gbit), 2 Gbit, 4 Gbit, 8 Gbit, 10 Gbit, 14 Gbit, 20 Gbit or other bandwidth fiber optic links. Furthermore, optoelectronic devices of other types and configurations, or having components that differ in some respects from those shown and described herein, can also benefit from the principles disclosed herein.

FIG. 1 illustrates an embodiment of an operating environment of a transmitter 100 including a laser module 110 having a laser array 112 optically coupled with a PIC 114. As shown, the transmitter 100 includes the laser module 110 having the laser array 112 optically coupled to optical components 116 that are optically coupled to a PIC 114.

The laser module 110, through the optical components 116 and PIC 114, is optically coupled to an optical outlet port 102 in the transmitter 100 that is optically coupled to an outlet optical fiber ribbon 104 from the transmitter 100. This embodiment of the invention as well as all other embodiments of the invention can be combined or modified with other embodiments or include other principles or elements described herein.

Figure 1A:
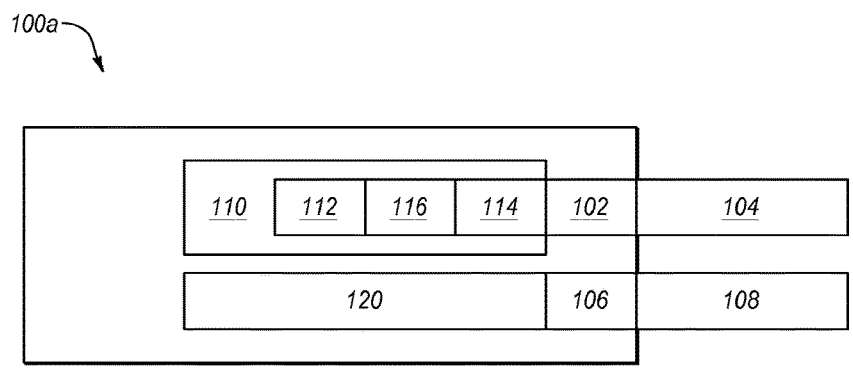
FIG. 1A illustrates an embodiment of a transceiver having separate TOSA and ROSA.

FIG. 1A shows a transceiver 100a that includes a TOSA 110 and ROSA 120.

The TOSA has the laser array 112 optically coupled to the optical components 116 that are optically coupled to the PIC 114. The TOSA 110, through the optical components 116 and PIC 114, is optically coupled to an optical outlet port 102 in the transceiver 100a that is optically coupled to an outlet optical fiber ribbon 104 from the transceiver 100a. The transceiver 100a also includes the ROSA 120 optically coupled an optical inlet port 106 that is optically coupled to an inlet fiber 108, such as a single fiber or fiber ribbon.

Figure 1B:
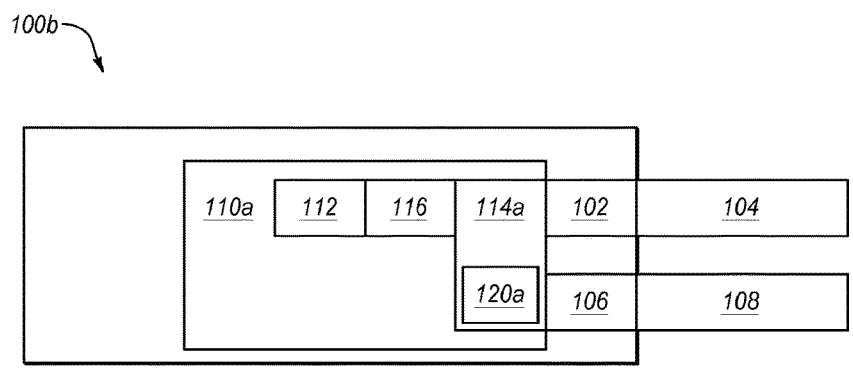
FIG. 1B illustrates an embodiment of a transceiver with a photonic integrated circuit (PIC) having a receiver photodiode.

FIG. 1B also shows a transceiver 100b that includes a laser module 110a having the laser array 112 optically coupled to optical components 116 that are optically coupled to a PIC 114a. The laser module 110, through the optical components 116 and PIC 114a, is optically coupled to an optical outlet port 102 in the transceiver 100b that is optically coupled to an outlet optical fiber ribbon 104 from the transceiver 100b. The transceiver 100b also includes a receiver 120a that is embedded in or integrated with the PIC 114a of the laser module 110a. The receiver 120a is optically coupled an optical inlet port 106 of the transceiver 110b that is optically coupled to an inlet fiber 108.

Figure 2:
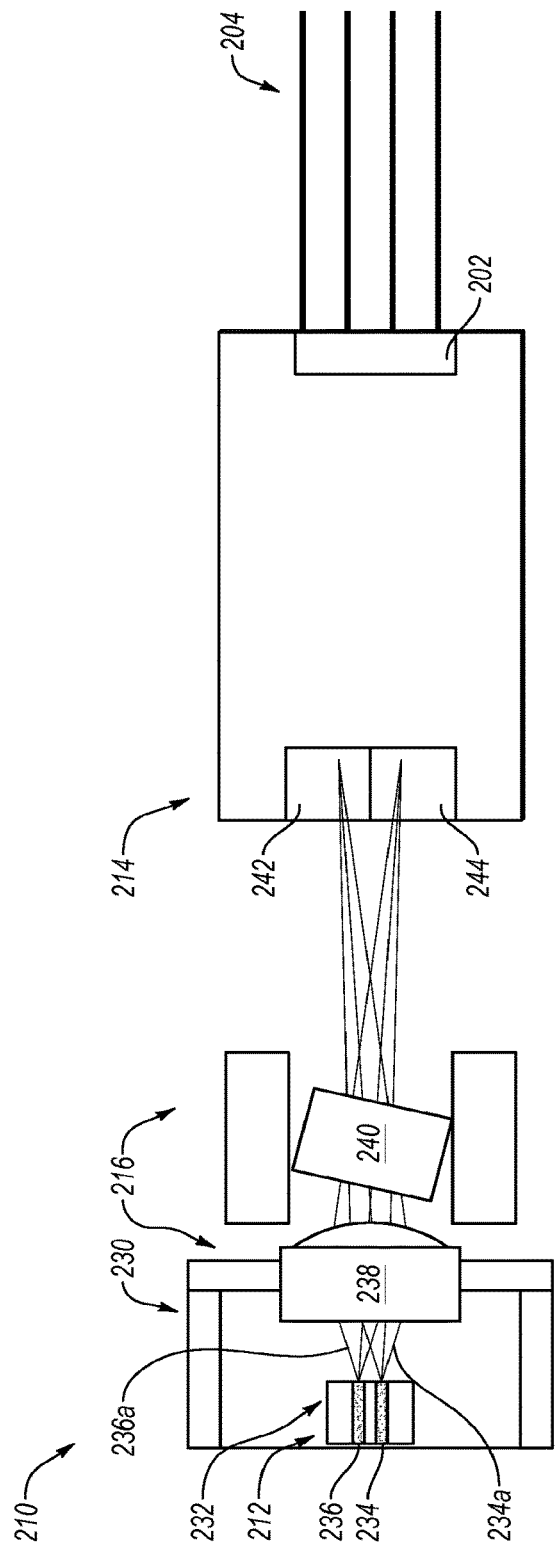
FIG. 2 illustrates an embodiment of a laser module.

FIG. 2 illustrates a laser module 210 having the laser array 212 optically coupled to optical components 216 that are optically coupled to the PIC 214. The laser module 210, through the optical components 216 and PIC 214, is optically coupled to an optical outlet port 202 that is optically coupled to an outlet optical fiber ribbon 204. The laser module 210 includes a hermetic housing 230 that is hermetically sealed that contains the laser array 212. The hermetic housing 230 can be evacuated or gas (e.g., air, nitrogen, halogen, etc.) filed. The laser array 212 includes a single laser chip 232 that has a first laser diode 234 separate from a second laser diode 236 by a defined separation pitch. The first laser diode 234 emits a first laser beam 234a of a first wavelength and the second laser diode 236 emits a second laser beam 236a of a second wavelength, where the first and second wavelengths can be the same, substantially the same (e.g., +/−10%, 5%, 2%, 1%), or different (e.g., 1310 nm and 1550 nm). The first laser beam 234a and second laser beam 236a pass through a focusing lens 238 before passing through an optical isolator 240. The focusing lens 238 focuses the first laser beam 234a to a first optical inlet port 242 on the PIC 214 and focuses the second laser beam 236a to a second optical inlet port 244 on the PIC 214. It is noted that as illustrated, the first laser beam 234a and second laser beam 236a; however, the may be separate and focused into the PIC 214 with or without crossing. While the focusing lens 238 is only shown with the output surface being curved or rounded, the input surface can also be curved or rounded as illustrated and described herein. The optical isolator 240 can be a free space isolator such as having a faraday rotor bound on both ends by polarizers. The hermetic housing 230, focusing lens 238, and isolator 240 can be configured as standard in the art, and can include any type thereof.

Figure 2A:
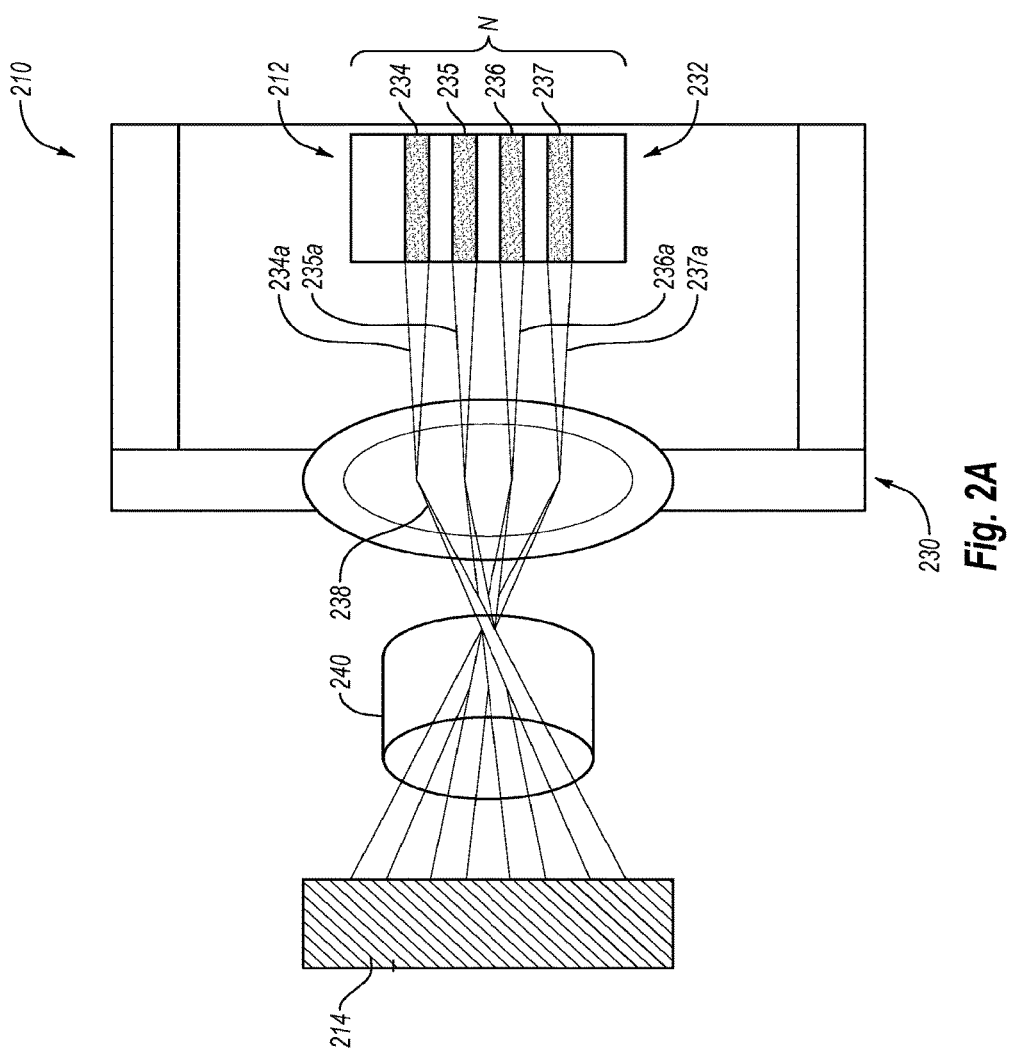
FIG. 2A illustrates an embodiment of a laser array and hermetic package for a laser module.

FIG. 2A illustrates an embodiment of a portion of the laser module of FIG. 2, which shows the laser array 212 in the hermetic housing 230 optically coupled through the focusing lens 238 and isolator 240 with the PIC 214. The laser array 212 is shown to have a laser chip 232 having a plurality of laser diodes 234, 235, 236, 237; however, any number of laser diodes can be included on the laser chip 232 as shown by the bracket and N is an integer defining the number of laser diodes on the laser chip 232. Alternatively, the bracket and N can define the number of individual laser chips 232 in the hermetic housing 230, where N is an integer. The plurality of laser diodes 234, 235, 236, 237 each emit laser beams 234a, 235a, 236a, 237a that are focused by the focusing lens 238 onto discrete locations on the PIC 214. The focused laser beams 234a, 235a, 236a, 236a pass through the isolator 240.

Figure 2B:
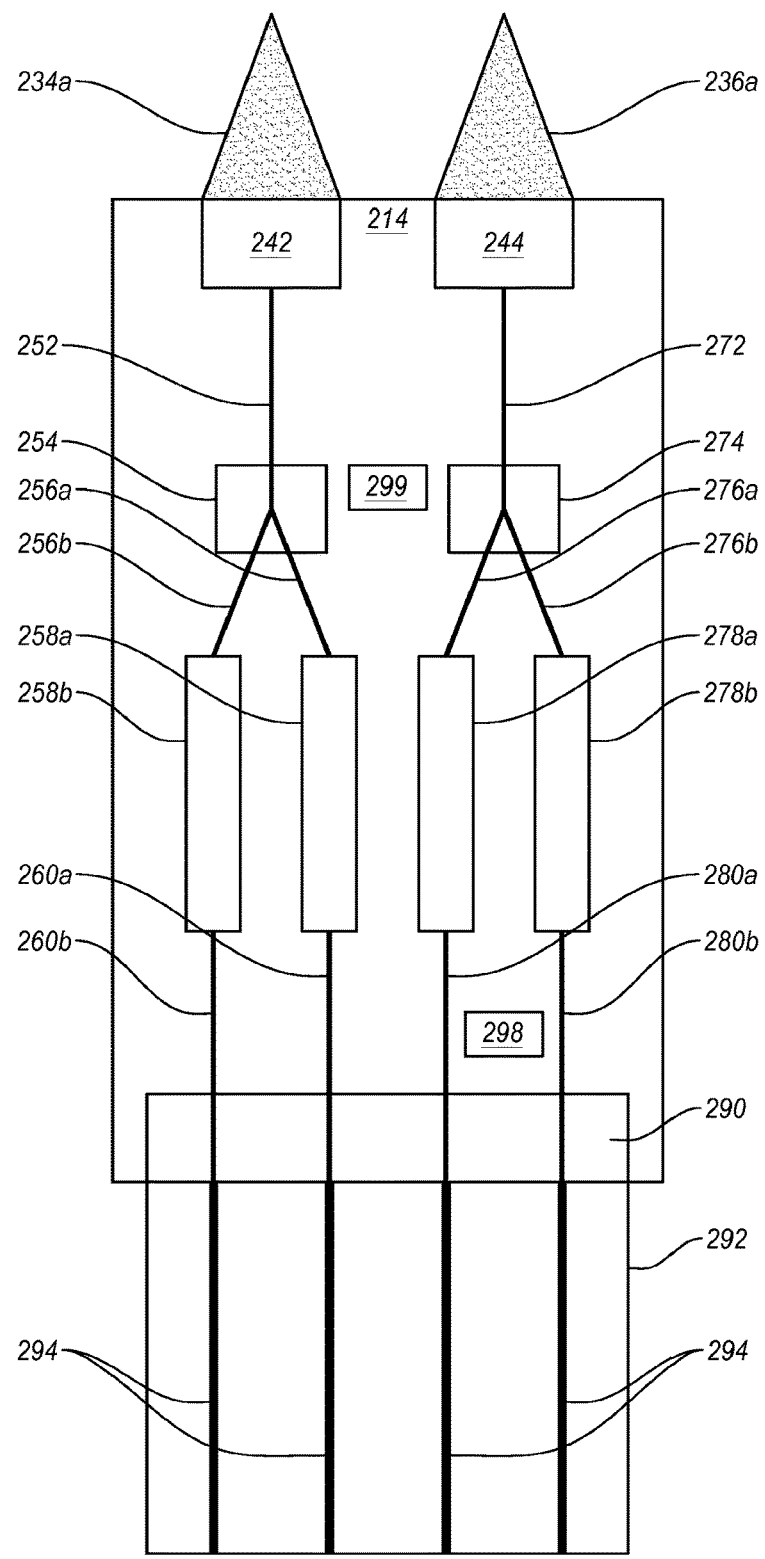
FIG. 2B illustrates an embodiment of a PIC.

FIG. 2B illustrates an embodiment of the PIC 214 illustrated in FIG. 2. The PIC 214 is shown to include the first optical inlet port 242 receiving the first focused laser beam 234a and second optical inlet port 244 receiving the second focused laser beam 236a. The first optical inlet port 242 is optically coupled to a first waveguide 252 or waveguide circuit thereof and the second optical port 244 is optically coupled to a second waveguide 272 of waveguide circuit thereof. The first waveguide 252 is optically coupled to a first optical splitter 254 that splits the first laser beam 234 into two first channels 256a, 256b. The second waveguide 272 is optically coupled to a second optical splitter 274 that splits the second laser beam 236a into two second channels 276a, 276b. Each of the two first channels 256a, 256b are modulated by first modulators 258a, 258b so as to provide data onto the laser beams therein. Each of the two second channels 276a, 276b are modulated by second modulators 278a, 278b so as to provide data onto the laser beams therein. Each of the two first modulators 258a, 258b output modulated laser beams in output channels 260a, 260b, which are in turn optically coupled to an optical port 290 that is operably coupled to a fiber ribbon 292. Each of the two second modulators 278a, 278b output modulated laser beams in output channels 280a, 280b, which are in turn optically coupled to the optical port 290. The fiber ribbon 292 is shown to include an optical fiber 294 for each of the output channels 260a, 260b, 280a, 280b.

Figure 2C:
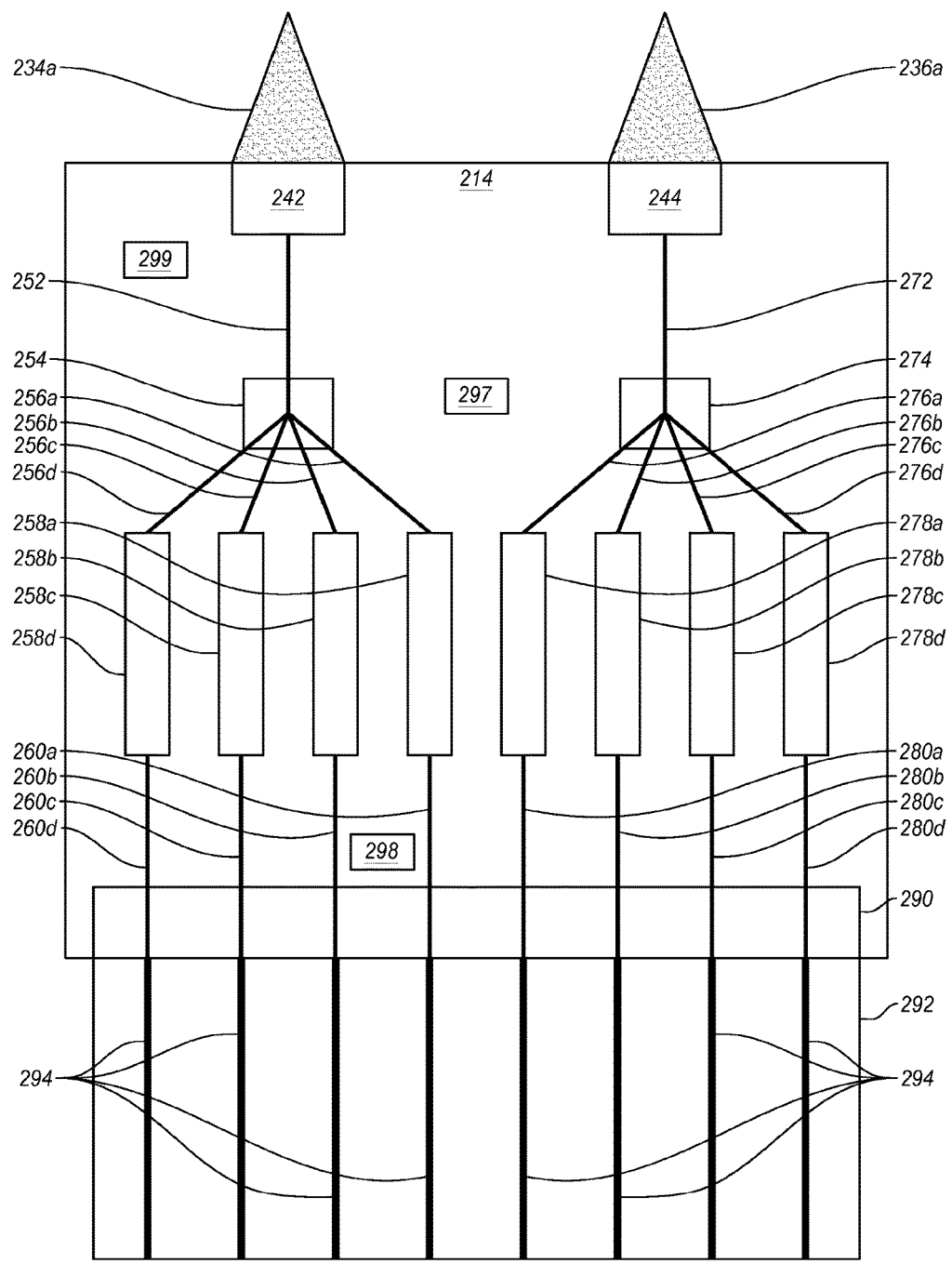
FIG. 2C illustrates another embodiment of a PIC.

FIG. 2B also shows that the PIC 214 can include an electronic component 298, such as any electron component described herein or known in the art to be included in a PIC. FIG. 2B also shows that the PIC can include an optoelectronic component 299, such as any optoelectronic component described herein or known in the art to be included in a PIC. FIG. 2C also shows that the PIC can include an optical component 297, such as any optical component described herein or known in the art to be included in a PIC. The locations of the optical component 297, electronic component 298, and/or optoelectronic component 299 can be as need or desired or standard or known in a PIC. Also, any number of the same type or different types of the optical component 297, electronic component 298, and/or optoelectronic component 299 can be included in the PIC.

FIG. 2C is similar to FIG. 2B; however, the beam splitters 254, 274 each split the laser beam into 4 different beams, which are modulated and routed to the optical fiber ribbon 292. The first waveguide 252 is optically coupled to a first optical splitter 254 that splits the first laser beam 234 into four first channels 256a, 256b, 256c, 256d. The second waveguide 272 is optically coupled to a second optical splitter 274 that splits the second laser beam 236a into four second channels 276a, 276b, 276c, 276d. Each of the four first channels 256a, 256b, 256c, 256d are modulated by first modulators 258a, 258b, 258c, 258d so as to provide data onto the laser beams therein. Each of the four second channels 276a, 276b, 276c, 276d are modulated by second modulators 278a, 278b, 278c, 278d so as to provide data onto the laser beams therein. Each of the four first modulators 258a, 258b, 258c, 258d output modulated laser beams in output channels 260a, 260b, 260c, 260d which are in turn optically coupled to the optical port 290 that is operably coupled to the fiber ribbon 292. Each of the four second modulators 278a, 278b, 278c, 279d output modulated laser beams in output channels 280a, 280b, 280c, 280d which are in turn optically coupled to the optical port 290. The fiber ribbon 292 is shown to include an optical fiber 294 for each of the output channels 260a, 260b, 260c, 260d, 280a, 280b, 280c, 280d.

Figure 2D:
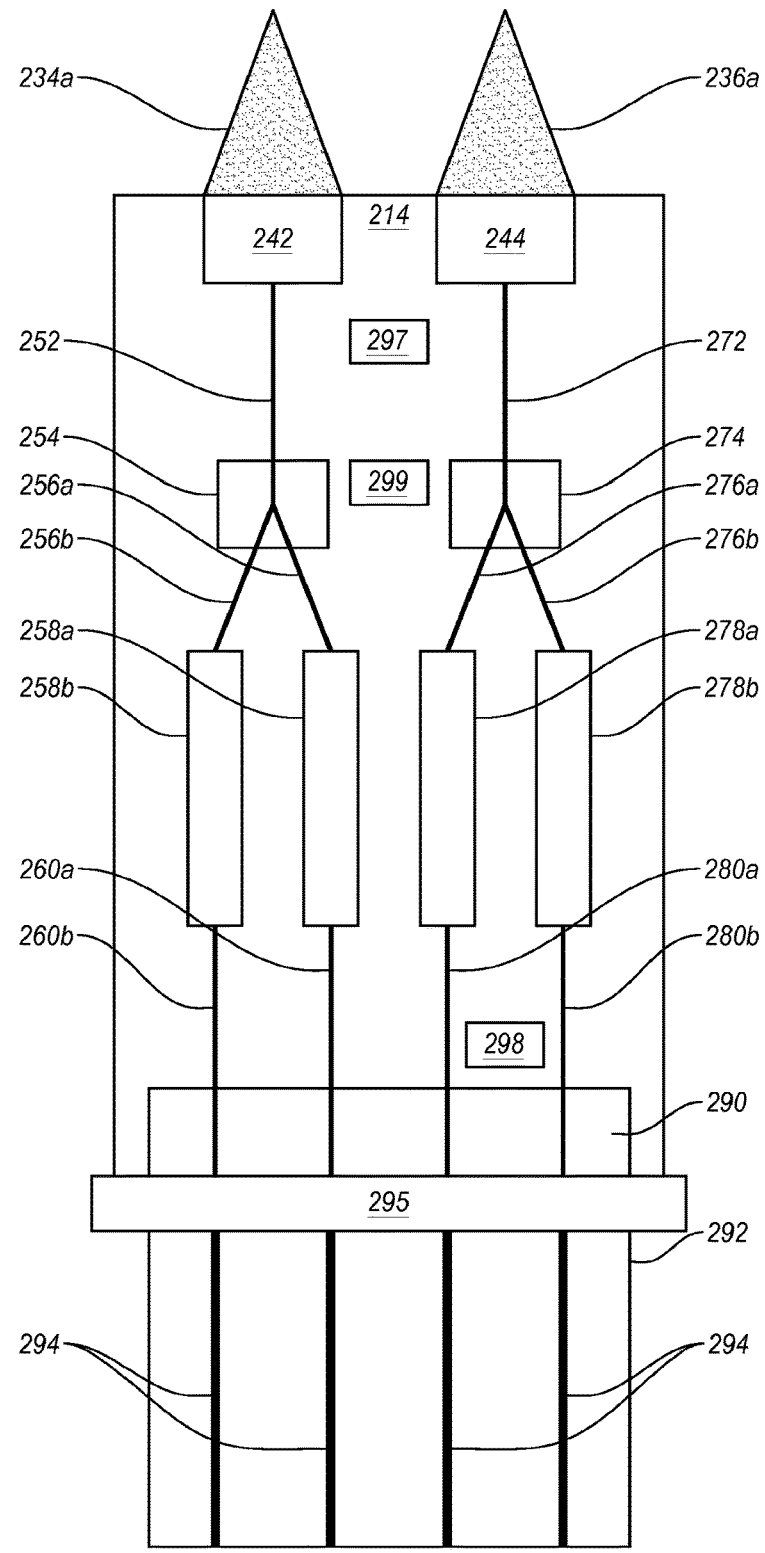
FIG. 2D illustrates yet another embodiment of a PIC.

FIG. 2D is substantially similar to FIG. 2B; however, the PIC 214 includes or is optically coupled to a wavelength-division multiplexing (WDM) device 295. This can allow for multiple wavelengths to be coupled into the same optical fibers 294 of the fiber ribbon 292.

Figure 2E:
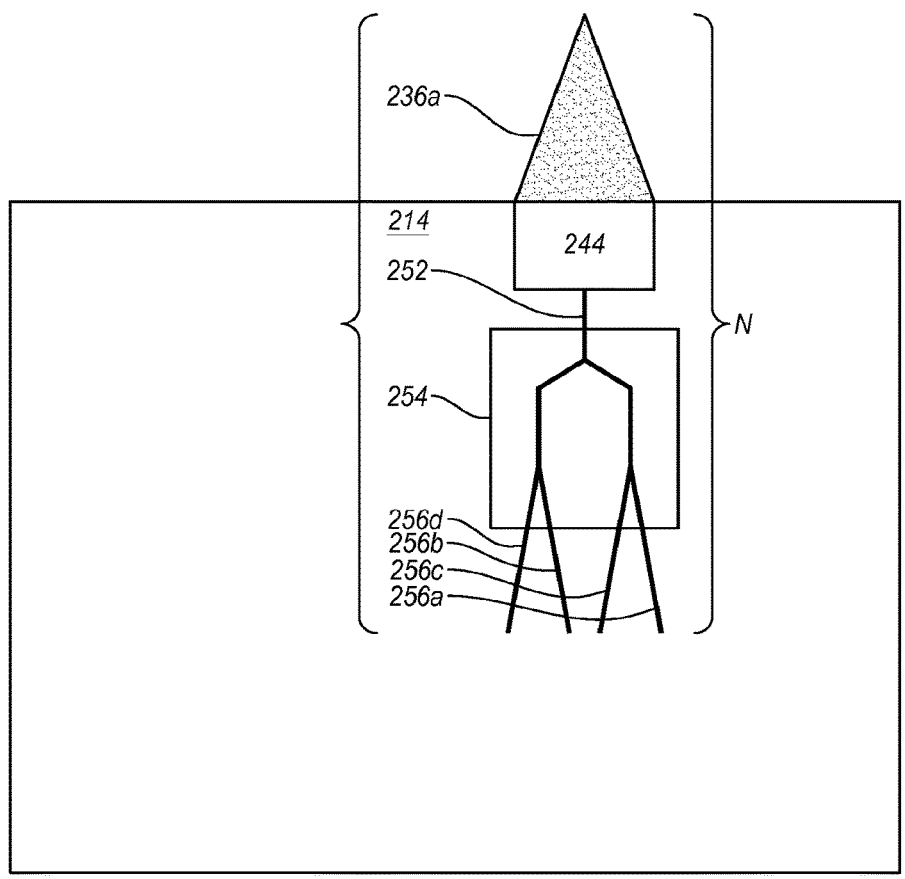
FIG. 2E illustrates an embodiment of a portion of a PIC.

FIG. 2E shows that the PIC 214 can be configured to include any number of optical inlet ports 244 and corresponding waveguides, optical splitters, and channels, or the like, which is shown by the bracket an N is an integer.

In one embodiment, the laser module can include a fine pitched DFB laser array as the optical source for 4-channel or higher parallel applications. In one example, the fine pitched DFB laser array can be used in place of a single high power CW laser for 4-channel parallel applications. The 4 channels can be from two laser diodes on a laser chip emitting 2 laser beams that are each split into two more laser beams by the PIC to form 4 separate laser beams. This configuration can be multiplied by 2, 4, 6, 8, or higher as chip technology and hermetic packaging techniques approve in order to increase the number of channels available.

In one embodiment, one or more of the DFB lasers in the laser array can include about 10 mW optical power. However, higher optical power for each DFB laser can be used. The DFB laser array can be configured to be sufficient for long range (LR) data transmission, where LR data communication can be at least or about 10 km. The DFB laser array can be configured for 10G LR data transmission. In one example, the DFB laser array can be configured for 4-channel 10G LR (e.g., 4×10G-LR) data communication applications. Such configurations of DFB lasers with sufficient power utilize the PIC for the data communication applications that are described. For example, a common DFB laser at 1310 nm can have about 10 mW optical power, and application with the PIC can obtain the 10G LR data transmission, such as in the 4×10G-LR data communication applications.

In one embodiment, the laser array can include a plurality of 20 mW single CW lasers, which can be configured for 4×10G-LR (10 km) applications. A 20 mW single CW laser is considered to be a higher powered laser compared to the DFB lasers that can be used, such as 10 mW DFB lasers. However, DFB laser arrays can be preferred over higher powered non-DFB CW lasers.

In one embodiment, the laser module can include one or more fine pitched 2×1 laser arrays, which includes 2 laser diodes on 1 laser chip. This can allow proven DFB chip technology to be implemented and combined with the PIC via the focusing lens, and optionally the isolator, for the laser module of the present invention. However, the laser module can include other types of laser arrays and other laser array arrangements. In one aspect, the laser array can be a linear laser array. In another aspect, the laser array can include a grid laser array having laser rows and laser columns, where the figures can show such an array by showing the lasers on an edge of the array, which can be top, bottom, or sides of the array. For example, the laser module can include laser arrays with high numbers of lasers in order to obtain higher channel count applications. Some examples of laser arrays an include 2, 4, 6, 8, 10, 12, 14, 16, 18, or 20 or higher lasers as laser chip manufacturing technologies advance. The lasers in the array may be individual lasers on separate substrates or a single substrate having multiple lasers, or combinations thereof. Some examples of laser arrays can include DFB laser arrays configured as 10×10G or 10×25G lasers, where the 10 indicates the number of channels output from the PIC.

In one embodiment, the laser chip can be a fine pitch laser chip, where the pitch is considered the distance or mechanical dimension between adjacent laser diodes on the same laser chip. Fine pitch laser chips are considered to have less than or about 50 μm between adjacent laser diodes. In one aspect, the fine pitch laser chip can have between 10 μm pitch and 50 μm pitch, between 20 μm pitch and 40 μm pitch, between 25 μm pitch and 35 μm pitch, or about 30 μm pitch. Data has shown that 10 μm pitch laser chips can be prepared. Some fine pitch laser chip examples can be 12 μm pitch or 15 μm pitch. The unique laser diodes can fit in a single hermetic package that uses only single optical components, which focus the unique lasers onto unique laser spots onto the PIC optical inlet ports. Additionally, the PIC can have a pitch, which is the distance between the optical inlet ports thereof. The PIC pitch can be 3-4 times the laser array pitch. If the optical inlet ports have a 100 micron pitch on the PIC, then there is about a 25 micron pitch on the laser array. Similarly, the PIC pitch can be calculated based on the laser array pitch.

In one embodiment, the plurality of lasers in the laser array of the laser module of the present invention can be included in the same hermetic package. However, the lasers of the laser array may optionally be in separate hermetic packages. The application of the lasers in the laser array in the same hermetic package can reduce costs because the lasers can share the same optical components, such as same lens, collimating lens, focusing lens, isolator, wave plate, mirror, tilt mirror, MEMS tilt mirror, waveguides, diffraction gratings, or other optical components or optical features employed in laser modules.

In one embodiment, the lasers of the laser array can share one or more of the same optical components, such as same lens, collimating lens, focusing lens, isolator, wave plate, mirror, tilt mirror, MEMS tilt mirror, waveguides, diffraction gratings, or other optical components or optical features employed in laser modules. Such sharing can be employed when the lasers are in the same hermetic package or in different hermetic packages. However, whether in the same hermetic package or different hermetic packages, each of the lasers of the laser array may optionally include its own optical components, such as same lens, collimating lens, focusing lens, isolator, wave plate, mirror, tilt mirror, MEMS tilt mirror, waveguides, diffraction gratings, or other optical components or optical features employed in laser modules.

In one embodiment, the hermetic package has a single lens, which is configured as a focusing lens. The focusing lens can have a rounded light receiving side and a rounded light emitting side. That is, both sides of the focusing lens can be rounded or curved. However, only one side of the focusing lens may be rounded or curved in one aspect. The hermetic package can include a lens frame for the lens. The single focusing lens can form specific focused spots from each laser diode of the laser array on the PIC. The focused spots can be at optical inlet ports of the PIC.

In one embodiment, the lasers of the laser array can each include the same or substantially the same wavelengths of emitted laser light. In one aspect, each laser diode on the laser chip can be substantially exactly the same. The laser diodes on the laser chip that are the same or similar can be DBR or DFB lasers.

Optionally, different optical components can be used to distinguish between the different lasers of the laser array. For example, a wave plate can be used to polarize laser light of one laser to distinguish such polarized light from other lasers of the laser arrays. Various combinations of optical components can be used when the laser array has a plurality of lasers with the same wavelength. For example, some lasers can include no optical element, some can include ½ wave plate, some can include ¼ wave plates, or combinations thereof.

In one embodiment, two or more lasers of the laser array can have different wavelengths that are distinguishable from each other. In one example, each laser can have different wavelengths from the other lasers in the laser array. The configuration of the laser can be modulated with grating to change the wavelength. Each laser diode can have a unique grating kappa or corrugation to determine the wavelength.

In one embodiment, the laser module can include a wavelength-division multiplexing (WDM) device in order to reduce the number of fibers out of the laser module. The WDM can be between the PIC and the output optical fibers. The WDM can be after modulation. As such, multiple wavelengths can be passed through the output optical fibers. The WDM can be used as is common in laser modules.

In one embodiment, at least one of the lasers in the laser array can emit laser light at about 1310 nm. However, all of the lasers in the laser array can emit laser light at about 1310 nm or there about, such as a range of wavelengths near 1310 nm. In one aspect, the laser light can vary from 1310 nm, such as from 1260 to 1370 nm. For example, the laser light can vary from 1310 nm+/1 10 nm, 20 nm, 30 nm, 40 nm, 50 nm, or 60 nm.

In one embodiment, at least one of the lasers in the laser array can emit laser light at about 1550 nm. However, all of the lasers in the laser array can emit laser light at about 1550 nm or there about, such as a range of wavelengths near 1550 nm. In one aspect, the laser light can vary from 1550 nm, such as from 1490 to 1610 nm. For example, the laser light can vary from 1310 nm+/1 10 nm, 20 nm, 30 nm, 40 nm, 50 nm, or 60 nm.

In one embodiment, the laser chip can be an InP laser chip. In one aspect, the laser can be an InGaAsP/InP laser chip.

In one embodiment, the laser can be configured as a VCSEL. In one aspect, the laser chip can be an InP silicon chip.

In one embodiment, the PIC can be a silicon photonic integrated circuit (SiPIC). This can use silicon technology to have multiple optical elements, such as one or more splitter and modulator as desired for an application. In one aspect, the PIC can include an integrated photo receiver (e.g., photodiode) for a transceiver application. In one aspect, the PIC can include electronic circuits to operate the electronic and/or optoelectronic components of the PIC, which can include the PIC having a laser driver, modulator driver, transimpedence amplifier (TIA), or the like found in a PIC, which can be a silicon circuit.

The PIC can include an optical inlet optically coupled to each of the individual laser diodes of the hermetic package. The PIC circuitry can include small waveguides that are coupled to each of the optical inlet optics, which waveguides can include splitters that split the laser beams into different channels, where the PIC can include a modulator for each channel.

The laser module can include optical components to couple each laser beam from each laser diode to different optical inlet ports on the PIC. This can include the laser module having a laser array in a hermetic package that has a single lens and an optical isolator between the lens and the PIC. The lens can be a focusing lens that focuses all of the laser beams into unique optical inlet ports of the PIC. The PIC can include a 1-to-2 beam splitter for each unique laser beam, or it can include a 1-to-4 beam splitter for each laser beam. Also, higher inlet laser beam splitting can occur, such as 1-to-N beam splitter, where N is an integer. In the 1-to-4 beam splitter, each subsequent channel will only receive ¼ of the light from the laser beam (minus some coupling loss or other loss). This concept can be multiplied by the number of unique laser diodes on the laser chip, such as described herein.

In one embodiment, the PIC can include a modulator for each of the channels formed therein. That is, each of the channels that are output can have a unique modulator to modulate data on the laser light passing through the unique channel waveguide in the PIC.

In one embodiment, the PIC can include an integrated modulator driver, such as a CMOS driver. In one aspect the PIC can include a modulator driver that is separate but operably coupled to the modulator of the PIC.

In one embodiment, the laser module can be configured for various arrangements and distances between the laser chip, the focusing lens, and the PIC. In one example, the laser module can be configured for 3× or 4× magnification to bring a DFB having 0.3 NA to about 0.1 NA (numeric aperture) of the PIC, which can be done with about 150 um spacing between the optical inlet ports on the PIC. This can be done substantially as focusing optical components as the focusing lens can focus each unique laser beam onto a unique optical inlet port of the PIC. The lens position can be changed in position between the laser and PIC to determine magnification. To get maximum coupling ratio to get magnification of the beam, the beam profile can define the dimensions. The laser can include a 0.3 NA to 0.4 NA, and then on the PIC side to get good coupling there can be 0.1 NA, which results from 3× to 4× magnification. The distance to the PIC from the lens divided by the distance from the lens to laser. The NA is relative to the cone of laser light emitted from the laser diode. The distances can be adjusted as needed or desired.

The laser light that is focused by the focusing lens can pass through an optical isolator. The optical isolator can be any standard or free space optical isolator. In one example, the optical isolator can include two magnets on opposite sides with a material therebetween where the light passes through. The middle portion that the light passes through can include a polarizer on each end with a faraday rotor in the middle. Such isolators are well known in the art. However, other free space isolators can be used. This results in free space air gaps between the lens and isolator and free space air gaps between the isolator and PIC.

In one embodiment, the PIC can be configured with two or more optical inlet ports that receive laser light from two different laser diodes in the hermetic package. The PIC includes an optical waveguide for each optical inlet port. Each waveguide can be coupled to a beam splitter, such as a waveguide beam splitter (e.g., 2 or 4 channels from each beam). The splitter has two or four downstream waveguides, with one downstream waveguide per channel, which channel waveguides are referred to herein as channels. Each channel can include a photonic modulator (e.g., integrated silicon photonic modulator), that modulates data onto each laser beam in the channels. The modulator can be inferiometer based, which can be controlled by electronic signal. Each channel can be coupled to an independent fiber, which can be single fibers or fiber ribbon.

Additionally, the PIC can also include: low loss interconnect waveguides, power splitters, optical amplifiers, TIA amplifier, optical modulators, filters, and other elements of common PIC devices. Also, the PIC may also include additional lasers diodes. In one embodiment, the PIC can include one or more optical detectors, such as photodiodes (e.g., germanium photodiode grown in the silicon-based pic), which can be useful when the laser module is a transceiver. As such, the photodiodes in the PIC can be used for the receiver portion of the transceiver and the laser chip and PIC can be used for the transceiver portion.

In one embodiment, the PIC can be configured to include one or more arrayed waveguide gratings (AWG). The AWG in the PIC can be configured as an optical multiplexer or an optical de-multiplexer. Accordingly, the laser module with the AWG can be configured as a wavelength division multiplexed (WDM) fiber-optic communication system. In one aspect, the laser module can include a WDM device between the PIC outlet ports and the transmission fiber optic cables.

In one embodiment, the laser module can be configured as an externally modulated laser (EML) with a modulator separate from the laser chip. The modulator can be combined with the PIC in order to modulate data onto the different channels of the PIC. The PIC can include a unique modulator for each channel.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. It should be understood that elements of one embodiment can be applied to other embodiments provided herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety, which can be applied to the present invention, including: Photonic Integration Trends, T. L. Koch, GENI Optical Workshop, Arlington, Va., Sep. 25, 2007; CMOS Photonics Today & Tomorrow, Dave D'Andrea, Microphotonics Center Spring Meeting, May 2009; Silicon Photonics: Challenges and Future, W. S. Ring, 2007; U.S. Pat. No. 7,474,813; U.S. Pat. No. 7,536,067; U.S. Pat. No. 8,280,255; U.S. 2010/0220763; U.S. 2010/0284647; U.S. 2011/0222571; U.S. 2011/0249936; and U.S. 2012/0189306.

The invention claimed is:

1. A photonic integrated circuit (PIC) comprising:
   a plurality of optical inlet ports integrated on a surface of the PIC where each individual optical inlet port is configured to optically couple to a corresponding laser diode via a focusing lens;
   a plurality of waveguides each coupled to one of the plurality of optical inlet ports;
   a plurality of optical splitters each coupled to one of the plurality of waveguides and each optical splitter splits into two or more optical channels and where each optical channel is integrated in the PIC;
   a plurality of modulators each coupled to one of the optical channels; and
   a plurality of output channels each coupled with one of the modulators.

2. The PIC of claim 1, wherein the plurality of optical inlet ports have a pitch of about 30 microns to about 150 microns.

3. The PIC of claim 1, wherein the plurality of optical inlet ports have a pitch of about 40 microns to about 200 microns.

4. The PIC of claim 1, comprising an optical outlet port, wherein the optical outlet port is coupled with the plurality of output channels such that each individual output channel is capable of being optically coupled with one of a plurality of optical fibers.

5. The PIC of claim 1, wherein the PIC has more optical output channels than optical inlet ports.

6. The PIC of claim 5, wherein the number of optical output channels is at least twice the number of optical inlet ports.

7. The PIC of claim 4, further comprising a wavelength division multiplexing device optically coupled to the optical outlet port.

8. The PIC of claim 1, further comprising an integrated waveguide for each optical inlet port.

9. The PIC of claim 1, further comprising an optical splitter optically coupled to each integrated waveguide that splits into two or more optical channels downstream from the optical splitter.

10. The PIC of claim 1, further comprising an integrated modulator for each optical channel.

11. The PIC of claim 1, further comprising a substrate defining the PIC, the substrate being silicon.

12. The PIC of claim 1, further comprising at least one electronic component included in the PIC.

13. The PIC of claim 12, wherein the at least one electronic component is selected from laser driver, modulator driver, transimpedence amplifier, or combinations thereof.

14. The PIC of claim 12, further comprising an electronic circuit coupled to the at least one electronic component.

15. The PIC of claim 1, further comprising at least one optoelectronic component included in the PIC.

16. The PIC of claim 1, wherein the at least one optoelectronic component includes at least one receiver photodiode.

17. The PIC of claim 5, wherein the number of optical output channels is at least four times the number of optical inlet ports.

18. The PIC of claim 1, comprising a modulator for each optical channel.

19. The PIC of claim 15, wherein the at least one optoelectronic component includes at least one laser diode.

20. The PIC of claim 1, further comprising on or more arrayed waveguide gratings.

* * * * *